United States Patent [19]

Aichert et al.

[11] 4,233,342

[45] Nov. 11, 1980

[54] METHOD FOR VAPOR-COATING TURBINE BUCKETS

[75] Inventors: Hans Aichert; Walter Dietrich, both of Hanau am Main; Otto-Horst Hoffmann, Rodenbach; Friedrich Stark, Langenselbold; Herbert Stephan, Bruchköbel, all of Fed. Rep. of Germany

[73] Assignee: Leybold-Heraeus GmbH, Cologne, Fed. Rep. of Germany

[21] Appl. No.: 962,836

[22] Filed: Nov. 21, 1978

[30] Foreign Application Priority Data

May 13, 1978 [DE] Fed. Rep. of Germany ....... 2821118

[51] Int. Cl.$^2$ ............................................. B23K 35/12
[52] U.S. Cl. .................................. 427/251; 427/255.5; 416/241 R; 29/156.8 B
[58] Field of Search ................... 427/248 G, 251, 250, 427/424, 425; 416/241, 241 A, 241 B; 29/156.8 B

[56] References Cited

U.S. PATENT DOCUMENTS

| | | | |
|---|---|---|---|
| 3,620,815 | 3/1969 | Blechman | 427/251 |
| 4,082,870 | 4/1978 | Yenni | 427/425 |

*Primary Examiner*—Ronald H. Smith
*Assistant Examiner*—Richard Bueker
*Attorney, Agent, or Firm*—Sprung, Felfe, Horn, Lynch & Kramer

[57] ABSTRACT

Method for vacuum depositing corrosion and oxidation resistant alloy coatings on turbine buckets having leading edges and trailing edges, with simultaneous rotation of the turbine buckets about their longitudinal axis in a vapor stream above a vapor source. The time of stay of each element of the surface above the vapor source is varied during a 360° rotation such that it is shortest when the leading edges and the trailing edges are pointed towards the vapor source and longest when the concave and convex flanks are presented to it.

5 Claims, 3 Drawing Figures

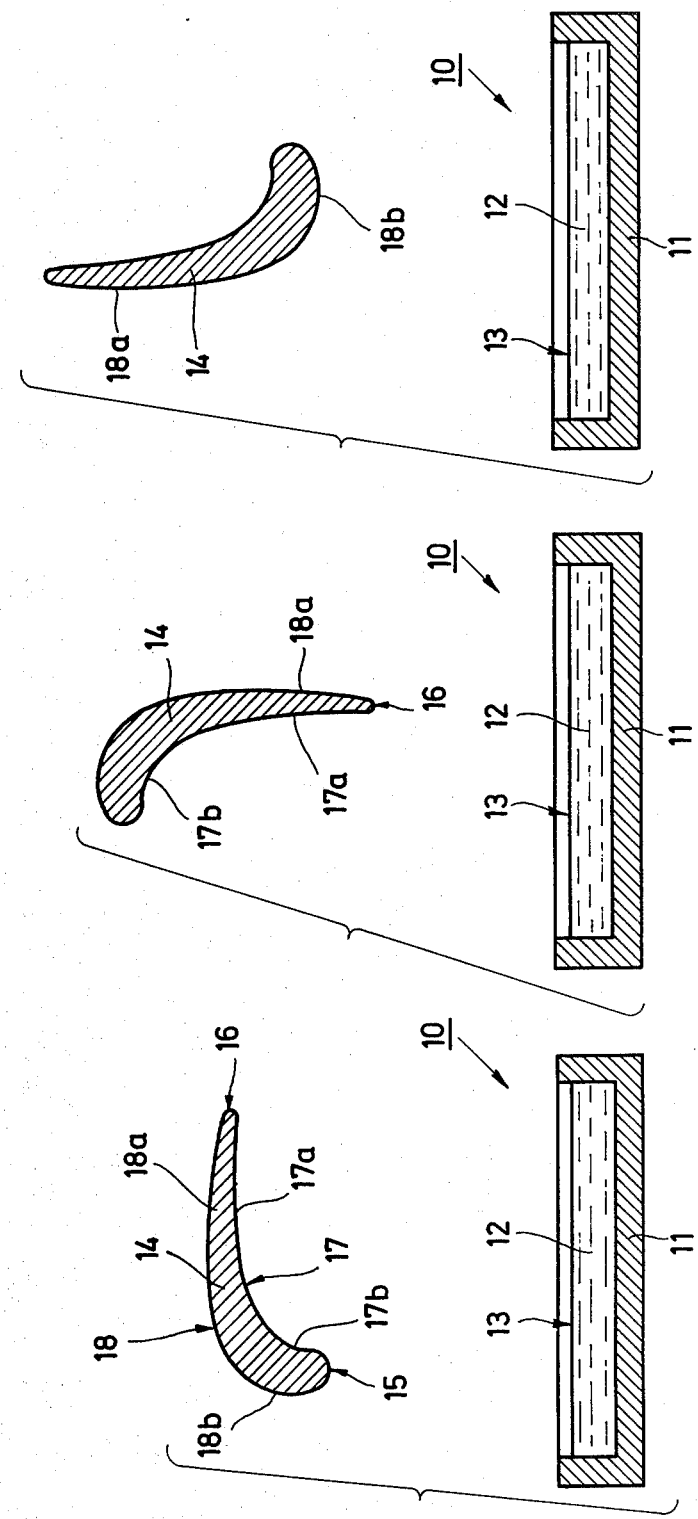

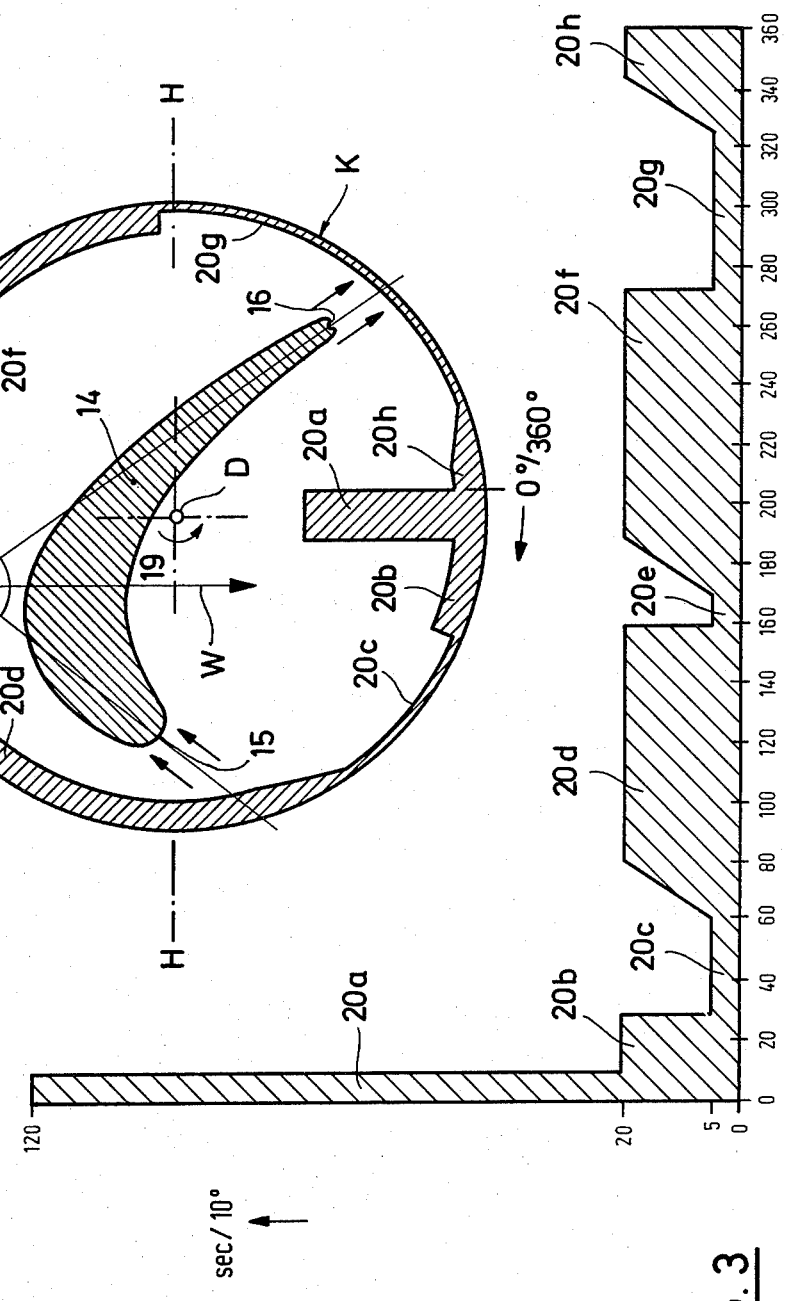

METHOD FOR VAPOR-COATING TURBINE BUCKETS

BACKGROUND

This invention relates to a method for the vacuum depositing of corrosion and oxidation resistant alloy coatings on all sides of curved turbine buckets having leading edges and trailing edges, with the simultaneous rotation of the turbine buckets about their longitudinal axis in the vapor stream above a vapor source.

In connection with turbine buckets, there is a distinction to be made between runner buckets and nozzle buckets. The runner buckets consist generally of a blade and a base, the base having on the side facing the blade a substantially rectangular surface that is virtually perpendicular to the blade. In the case of the nozzle buckets, as a general rule the end farthest from the base is provided with an enlargement analogous to the base, the surfaces of the bases and of the enlargements opposite them making up a cylindrical ring after all of the buckets have been installed. The "longitudinal axis" of such buckets is to be interpreted as an imaginary axis running parallel or substantially parallel to the generatrices of the bucket blade. The longitudinal axis can coincide with the axis of rotation of the substrate holder during the rotation of the bucket in the vapor stream, but it can also be at a distance therefrom, i.e., the bucket rotates about its longitudinal axis while the longitudinal axis rotates about the axis of rotation of the substrate holder.

It is known to cause both axially symmetrical bodies as well as bodies of complex shape to rotate about one or more axes in the vapor stream for the purpose of coating the substrates on all sides with a condensed layer of material. Particularly in the case of complex composite rotatory movements, as for example in the case of the known involute movements, reliance is placed on laws of probability whereby the entire surface that is exposed to the vapor will be coated with the evaporated material with at least some degree of uniformity. The relative uniformity of the deposit on the substrates is favored by the diffuse character of the vapor stream and to some extent by the collision of vapor particles with molecules of the residual gas atmosphere. Reliance on probability, however, is no longer adequate for the coating of precision parts such as turbine buckets. Especially in the case of gas turbines, a high temperature is desired at the output of the combustion chamber and at the input of the turbine stages for the purpose of improving efficiency and thereby reducing the specific fuel consumption. This heating has resulted in a differentiated make-up especially of the runner buckets. The core of these buckets, which is the substrate during the vacuum coating, consists as a rule of highly heat resistant steel alloys of known composition. These alloys, however, are not sufficiently corrosion resistant and oxidation resistant in the desired temperature range. The manufacture of the whole turbine bucket from appropriately resistant material is unfeasible for reasons of strength. Consequently, manufacturers have resorted to applying corrosion resistant and oxidation resistant surface coatings to turbine buckets for the purpose of increasing their life and safety factor. It must be remembered that the lives of hundreds of human beings depend to no small degree on the quality of turbine buckets. The problems involved and methods for coating gas turbine buckets with appropriate surface materials are described in a publication by the Chromalloy American Corporation, N.Y., entitled, "High Temperature Resistant Coating for Super-Alloy" by Seelig et al. However, the publication does not say in what manner a uniformly thick, dense, adherent coating, free of cracks and voids, can be obtained on the entire surface of buckets.

SUMMARY

This invention provides a vacuum depositing method of the kind described in the beginning, whereby a uniformly thick, dense, tightly adherent coating free of cracks and voids can be produced on the entire surface or periphery of turbine buckets.

This is achieved in accordance with the invention, in the initially described method, in that the exposure time, or time of stay of each unit of the surface above the vapor source, is varied during a 360° rotation such that when the leading and trailing edges are opposite the vapor source their time of stay is shortest and when the concave and convex flanks are facing the vapor source it is longest.

DESCRIPTION

Extensive experiments have shown that the application of vapor at a low angle is particularly detrimental to the formation of the coating. This low-angle application takes place when the individual vapor particles encounter the flank of the bucket at a very low angle, i.e., almost parallel to the surface. It has been observed that in this case the coatings develop gaps or seams of a thickness of perhaps 100 and $400 \times 10^{-3}$ mm running parallel or at a low angle to the substrate surface underneath. This threatens to weaken the bond between the substrate and the surface coating, which can be achieved, for example, by intermetallic diffusion. The surface coatings produced in this manner are not sufficiently resistant either chemically or mechanically. The three particularly dangerous areas are graphically represented in FIG. 1. The flaws that develop in the coating cannot be closed up even by the mechanical aftertreatment of the buckets, e.g., by glass bead blasting. Buckets containing such flaws are unusable.

Simply stated, the invention involves passing through the critical positions quickly during the vacuum coating process, while lengthening the time during which the surface units of the buckets in the uncritical locations are presented to the evaporating crucible.

The differences in the exposure times can be determined by experiment; a number of general indications are to be found in the detailed description of the invention.

The invention can be carried out in an entirely satisfactory manner by the use of the method of the invention, i.e., surface coatings having an extremely uniform thickness distribution are produced, without flaws, especially without gaps and seams. Furthermore, an optimum utilization of the expensive vaporizing material is achieved, combined with less contamination of the inner surfaces of the vacuum coating apparatus which are likewise unavoidably exposed to the vapor stream.

It has proven to be especially desirable to lengthen the time of exposure of the middle area of the concave flank in relation to the time of exposure of the middle portion of the convex flank by a factor of at least two, preferably by a factor of at least four. It is desirable to make the exposure time longest when the angle bisector between the leading edge angle and trailing edge angle is substantially vertically above the vapor source. Such a position is represented in FIG. 2.

It is desirable to make the exposure time one of the shortest whenever the part of the convex flank having the greatest radius of curvature is aligned approximately parallel with the vapor stream. Two positions in which this is the case are represented in FIGS. 1b and 1c.

An embodiment of the process of the invention will now be explained in detail with the aid of FIGS. 1 to 3.

FIGS. 1, a–c represent three particularly critical positions of the turbine buckets with respect to the vapor source, in which the vapor stream encounters the endangered areas at a low angle, FIG. 2 is a graphic representation of how certain exposure times are associated with individual angular positions of a given bucket profile, and FIG. 3 is a development of the graphic representation in FIG. 2, with an enlarged scale of the ordinates.

In all of the partial representations, a, b and c, in FIG. 1, vapor sources 10 are shown which consist of a planar, cooled evaporating crucibles 11; they are filled with evaporation material 12 which is kept in a molten state at least partially by bombardment with electron beams, for example. Such evaporation material would be, for example, alloys of the CoCrAlY and NiCoCrAlY groups. From the individual bath surfaces 13 vapor streams are emitted whose preferential direction is vertically upward. At a distance between about 150 and 500 mm above the bath surface 13 is a turbine bucket 14, actually representing a plurality of identical turbine buckets disposed within a field above the bath surface 13. FIG. 1 is thus intended only as a diagrammatic representation of the geometrical relationships involved.

Each turbine bucket has a leading edge 15 and a trailing edge 16. Between them is a concave bucket flank 17 and a convex bucket flank 18. The bucket flank 17 is divided into a flank portion 17a of great radius of curvature, and a flank portion 17b of small radius of curvature. In like manner, bucket flank 18 is divided into a flank portion 18a of great radius of curvature, and a flank portion 18b of small radius of curvature. The leading and trailing edges 15 and 16 are each well rounded; discharge apertures may be present in the trailing edge 16 for the discharge of a cooling gas. Details of the bucket profile will be determined by the design data of the turbine and are subject matter of the invention only to the extent that they affect the exposure timing.

In FIG. 1a there is represented a position in which there is a high rate of condensation on flank portion 17a, but a low rate of condensation on flank portion 17b. However, the circumstances are critical on the convex flank portion 18b on which, when the turbine bucket 14 is in this position, a low-angle encounter with the vapor takes place, which is responsible for the formation of gaps as described above. The position represented in FIG. 1a must consequently be passed through quickly.

In FIG. 1b, the trailing edge 16 is presented to the bath surface 13, and the flank portions 17a and 18a, which each have a large radius of curvature, are aligned approximately parallel to the flow of vapor. A low-angle impingement of the vapor particles also takes place on these portions, and its duration must be kept as brief as possible. For the flank portion 17b, the condensation conditions are favorable in this position, but this advantage must be surrendered in favor of avoiding the disadvantages incurred at the flank portions 17a and 18a.

Similar conditions obtain in the bucket position shown in FIG. 1c, in which the flank portion 18a is especially endangered by low-angle impingement. The favorable depositing conditions on the flank portion 18b must be passed through quickly to the benefit of the depositing conditions on flank portion 18a.

In FIG. 2, the same turbine bucket 14 as shown in FIG. 1 is represented on an enlarged scale. The axis of rotation is designated as D, and a horizontal reference line is indicated at H—H. Also represented are the entrance angle $\alpha$ and the exit angle $\beta$ in idealized form. In the present case, $\alpha=\beta$, and the angle bisector W is pointed perpendicularly to the bath surface which is not shown in FIG. 2, but is parallel to the line H—H.

The turbine bucket 14 is surrounded by a circle K on which is plotted at 10° intervals the time during which the individual portions of the bucket surface are directly facing the bath surface. The count begins at the point marked 0° and runs clockwise, i.e., the turbine bucket 14 rotates in the direction of arrow 19 above the bath surface. If the turbine bucket 14 together with the peripheral diagram 20, which has been accentuated by hatching, is rotated through a certain angle, the exposure time can be obtained perpendicularly underneath the axis of rotation D, in absolute values which can be related to the exposure times in the other angular positions of the turbine bucket 14.

The peripheral diagram 20 consists of a plurality of sections 20a to 20h distributed about the entire circumference of 360 degrees of angle. The radial dimension of sections 20b, 20d, 20f and 20h is approximately equal and is in a ratio of about 1:4 to the other sections whose radial dimensions 20c, 20e and 20g are substantially equal to one another. Particularly striking is the radial dimension of Section 20a, which corresponds to approximately six times the radial dimension of Section 20b, etc. In a practical embodiment, the absolute values for secion 20a amounted to about 120 seconds, those for section 20b and the following about 20 seconds, and those for sections 20c and the following approximately 5 seconds, with respect in each case to a rotation of 10 degrees of angle. In this manner it was possible to achieve the object of the invention in an entirely satisfactory manner for the bucket profile which is represented.

The peripheral diagram 20 is represented in developed form in FIG. 3, the degrees of angle being plotted on the abscissas and the absolute exposure times on the ordinates in seconds per ten degrees of angle, in a practical embodiment. However, the absolute exposure times are of less importance than the relations between the exposure times in the individual sections.

It can furthermore be seen in FIGS. 2 and 3 that the transitions between the individual sections of the diagram are in some cases gradual and in others abrupt. This represents an optimization of the exposure time variation.

It should also be noted that the rotatory speeds of the drive do not have to be more than zero for a particular exposure time. It is easily possible to provide for an exposure time of appropriate length by stopping the drive for a given length of time. This method can be selected especially when the bucket position is as shown in FIG. 2 with respect to the horizontal; in addition, the bucket can be stopped in a suitable position at the end of a vapor depositing procedure extending over several revolutions of the bucket and then it can be coated while standing still.

During the vaporization, the turbine buckets are maintained at an elevated temperature between 900° and 1100° C. by the application of heat.

What is claimed is:

1. Method for vacuum depositing corrosion-and oxidation-resistant alloy coatings on all sides of curved turbine buckets having leading edges and trailing edges, with simultaneous rotation of the turbine buckets about their longitudinal axes in the vapor stream above a vapor source which comprises non-uniformly rotating the turbine buckets with respect to speed of rotation to vary the time of stay of each element of the surface above the vapor source during a 360° rotation such that it is shortest when the leading edges and trailing edges are pointing towards the vapor source and longest when the concave and convex flanks are presented to it.

2. Method of claim 1 wherein the time of stay approximately in the middle range of the concave flank is greater than the time of stay in the middle range of the convex flank by at least a factor of 2.

3. Method of claim 2 wherein the time of stay is made longest while the angle bisector between the entrance angle and the exit angle is pointing towards the vapor source.

4. Method of claim 1 wherein the time of stay is kept among the shortest times of stay when the portion of the convex flank that has the greatest radius of curvature is disposed approximately parallel to the direction of the vapor stream.

5. Method of claim 2, wherein the factor is at least 4.

* * * * *